United States Patent
Sturm et al.

(10) Patent No.: US 6,178,925 B1
(45) Date of Patent: Jan. 30, 2001

(54) BURST PULSE CLEANING METHOD AND APPARATUS FOR LIQUID DELIVERY SYSTEM

(75) Inventors: Edward A. Sturm, New Milford, CT (US); Gautam Bhandari, New York, NY (US); Craig Ragaglia, Berlin, CT (US)

(73) Assignee: Advanced Technology Materials, Inc., Danbury, CT (US)

( * ) Notice: Under 35 U.S.C. 154(b), the term of this patent shall be extended for 0 days.

(21) Appl. No.: 09/409,042

(22) Filed: Sep. 29, 1999

(51) Int. Cl.[7] ................................ F22B 37/48
(52) U.S. Cl. ............... 122/390; 122/405; 118/715; 118/726
(58) Field of Search .............. 122/24, 40, 384, 122/390, 392, 405; 118/715, 726

(56) References Cited

U.S. PATENT DOCUMENTS

| | | | |
|---|---|---|---|
| 5,019,329 | * 5/1991 | Franklin et al. | 122/392 |
| 5,362,328 | 11/1994 | Gardiner et al. | . |
| 5,630,878 | * 5/1997 | Miyamoto et al. | 118/715 |
| 5,876,503 | * 3/1999 | Roeder et al. | 118/715 |
| 5,882,416 | * 3/1999 | Van Buskirk et al. | 118/726 |
| 6,019,849 | * 2/2000 | Yao et al. | 118/715 |

\* cited by examiner

Primary Examiner—Denise L. Ferensic
Assistant Examiner—Gregory A. Wilson
(74) Attorney, Agent, or Firm—Oliver A. M. Zitzmann; Steven J. Hultquist

(57) ABSTRACT

A liquid delivery apparatus for vaporizing a liquid to produce a vapor therefrom. The apparatus incorporates a vaporizer with a surface arranged to receive liquid thereon. A liquid feed assembly is provided, including (i) a liquid source and (ii) a liquid flow circuit coupled to the liquid source and arranged to discharge liquid onto the vaporizer surface during liquid vaporization operation. The apparatus features a burst purging assembly including a pressurized gas source joined in gas flow communication with the liquid flow circuit. The pressurized gas source is arranged to introduce a clearance burst of pressurized gas into the liquid flow circuit after completion of the liquid vaporization operation, so that hold-up liquid in the liquid flow circuit and/or vaporizer following completion of the liquid vaporization operation is discharged onto the vaporizer surface and vaporized. Such operation avoids retention of hold-up liquid in the liquid flow circuit until renewal of the liquid vaporization operation, such as would otherwise increase the residence time of liquid in the system, increase the susceptibility of the liquid flow circuit to contamination and plugging, and decrease the operating life of the system between maintenance events.

22 Claims, 3 Drawing Sheets

BURST PULSE CLEANING METHOD AND APPARATUS FOR LIQUID DELIVERY SYSTEM

BACKGROUND OF THE INVENTION

1. Field of the Invention

The present invention relates generally to method and apparatus for cleaning a liquid delivery system, e.g., of a type as used for generating a precursor vapor from a liquid precursor composition, for vapor transport to a deposition chamber for formation of a material film on a substrate.

2. Description of the Related Art

Chemical vapor deposition (CVD) is a highly desirable technique for depositing layers of thin film materials in the fabrication of semiconductor products.

In the CVD process, reactive precursor vapors are transported to a vapor deposition reactor, in which the vapor is contacted with a substrate at sufficiently elevated temperature to form a film thereon of deposited material from the precursor vapor. For many years, vapor delivery was accomplished by the use of bubblers in which inert gases were bubbled through volatile liquid reagents to effect saturation of the gas and transport of the resultant carrier gas/precursor vapor mixture to the reactor.

The application of new materials in semiconductor device manufacturing has dictated the corresponding use of new precursors for such materials. Many of these emerging precursors are non-volatile. For various reasons, including rate control, safety, reagent stability, and variety of available precursor materials, liquid delivery systems have replaced bubbler-based vapor transport systems for many materials and applications. In liquid delivery systems, a precursor liquid composition is metered and delivered to a vaporizer, with the resultant precursor vapor being flowed to the CVD process.

The continuing emergence of new chemistries poses novel and increasing challenges to the use of liquid delivery process systems. One example of such chemistries is the precursors available for CVD of copper thin films for interconnects in microelectronic device structures.

Copper is an important material in microelectronic device fabrication. Its high conductivity facilitates the formation of interconnects with greatly increased speed of response and smaller "landscape" requirements, relative to other metallization conductor materials such as aluminum. Various major semiconductor device manufacturers have targeted copper CVD as a major objective for development. The success of copper CVD hinges critically on the improvement of delivery and vaporization technology.

Copper precursors typically have low vapor pressure until they are heated within a few degrees of their decomposition temperatures. In order to prepare a concentrated reactive vapor from such precursors, it is necessary to heat these precursors to a temperature that is very close to the temperature at which decomposition occurs.

As a result, some decomposition unavoidably occurs. The extent of such decomposition may be minimized to some degree by the use of high precision process controllers for the liquid delivery system, but invariably there is some build-up of deposits, particles, clogs, byproducts, sludge, and/or other contamination which adversely affects vaporizer performance and drastically shortens the useful operating life of the liquid delivery system between maintenance events (when shutdown and cleaning of the system equipment is required).

Any significant shortening of the on-stream operating life of the liquid delivery system by reason of solids accumulation or other contamination therein is clearly undesirable. Further, some precursor compositions produce contamination that is very difficult, time-consuming and costly to remove.

The current state-of-the-art approach in liquid precursor vaporization using liquid delivery systems involves the use of high surface area vaporization elements, such as may be formed of sintered porous metal 'frit' material, stacks of high aspect ratio disks, etc., onto which the precursor liquid is flowed. The vaporization element is heated to an appropriate temperature for high-rate volatilization ("flash vaporization") of the introduced liquid, and normally a means (e.g., a carrier gas flow stream, blower, eductor, and/or other structure producing desired flow/pressure drop characteristics) to sweep away the precursor vapors as they are generated.

For chemistries that are prone to partial decomposition within the vaporizer, such as copper, the heated areas of the vaporizer may be flushed with a solvent medium between deposition cycles, as more fully described in U.S. Pat. No. 5,362,328 issued Nov. 8, 1994 in the names of Robin A. Gardiner, et al. for "Apparatus and Method for Delivering Reagents in Vapor Form to a CVD Reactor, Incorporating a Cleaning Subsystem," the disclosure of which hereby is incorporated herein by reference in its entirety.

In such "solvent flush" approach, the solvent medium is selected to dissolve any residual liquid and/or solid residue from the surfaces of the vaporization element and the interior surfaces of the vaporizer. The solvent flush step typically is conducted once every several hours of run time, and the liquid delivery system is equipped with a vent or a reactor bypass circuit to transport the solvent waste from the solvent flush step to a site for recycle, solvent recovery, filtration removal of contaminants, or other disposition.

However, with sensitive chemistries such as copper, the flush step is required quite frequently—e.g., between each and every coating cycle. This can substantially lengthen the process cycle and generate excessive amounts of waste in the process system.

SUMMARY OF THE INVENTION

Against the foregoing background, the liquid delivery system of the present invention embodies an advance in the art of using liquid precursor compositions for CVD.

In one aspect, the present invention relates to a liquid delivery apparatus for vaporizing a liquid to produce a vapor therefrom. Such apparatus comprises:

a vaporizer including a surface arranged to receive liquid thereon;

a liquid feed assembly including (i) a liquid source and (ii) a liquid flow circuit coupled to the liquid source and arranged to discharge liquid onto the vaporizer surface during liquid vaporization operation; and a burst purging assembly including a pressurized gas source joined in gas flow communication with the liquid flow circuit and arranged to introduce a clearance burst of pressurized gas into the liquid flow circuit after completion of the liquid vaporization operation so that hold-up liquid in the liquid flow circuit and/or vaporizer following completion of the liquid vaporization operation is discharged onto the vaporizer surface and vaporized, thereby avoiding retention of said hold-up liquid in the liquid flow circuit until renewal of liquid vaporization operation.

In another aspect, the present invention relates to a method of vaporizing a liquid to produce a vapor therefrom. Such method comprises:

providing a vaporizer including a surface arranged to receive liquid thereon;

feeding liquid from a liquid source through a liquid flow circuit and discharging liquid onto the vaporizer surface during liquid vaporization operation; and introducing a clearance burst of pressurized gas into the liquid flow circuit after completion of the liquid vaporization operation so that hold-up liquid in the liquid flow circuit and/or vaporizer following completion of the liquid vaporization operation is discharged onto the vaporizer surface and vaporized, thereby avoiding retention of the hold-up liquid in the liquid flow circuit until renewal of liquid vaporization operation.

The hold-up liquid in the liquid flow circuit and/or vaporizer (following completion of the liquid vaporization operation) that is discharged onto the vaporizer surface and vaporized, includes liquid that derives from the heated portion(s) of the flow circuit in which the likelihood of decomposition and plugging are greater than in the unheated portion(s) of the flow circuit, where "dead volume" liquid is of lesser criticality with reference to decomposition and plugging.

Other aspects, features and embodiments of the invention will be more fully apparent from the ensuing disclosure and appended claims.

DETAILED DESCRIPTION OF THE INVENTION, AND PREFERRED EMBODIMENTS THEREOF

Figure 1:
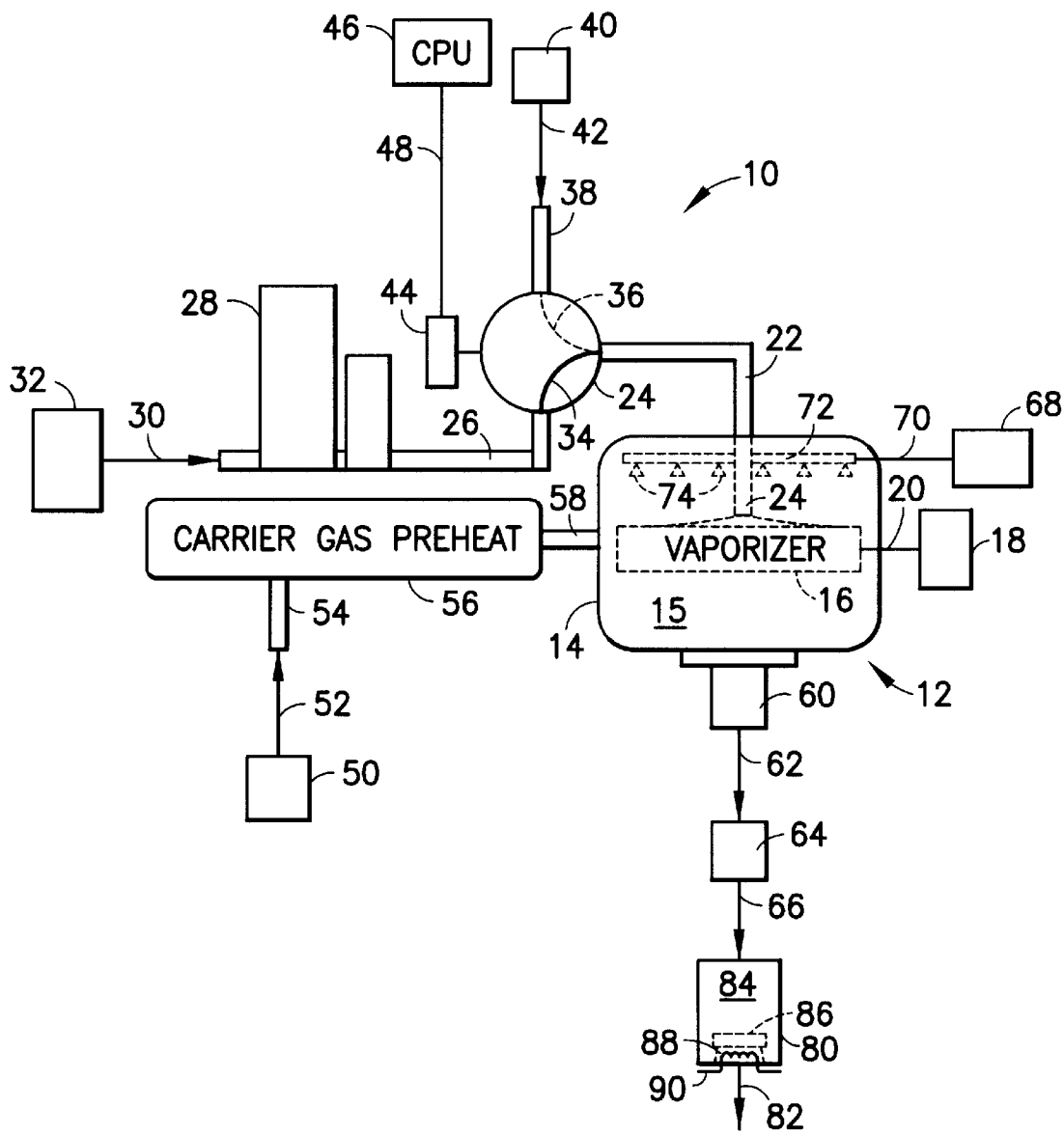
FIG. 1 is a schematic representation of an apparatus including a liquid delivery system and a chemical vapor deposition reactor, according to one embodiment of the present invention.

The apparatus and method of the present invention provide a quick, inexpensive, low-waste approach to cleaning a vaporizer of residual liquid when a coating (deposition) cycle is completed. The invention employs rapid purging of the liquid feed line to the vaporizer, in order to remove entrapped hold-up liquid otherwise retained in the line. By such expedient, decomposition of liquid precursor, which otherwise would occur due to long residence time in the heated vaporizer zone, is avoided.

In accordance with the invention, a sudden controlled burst of purge gas, preferably an inert gas, is utilized to empty out the low hold-up volume of liquid in the feed tube(s) that during active vaporization processing transport(s) the liquid precursor to the vaporization surface of the vaporizer element. Such "burst purge" will sweep the liquid from the heated portion of the liquid flow circuit feeding the vaporizer element with liquid, so that the liquid is swept by the purge gas onto the vaporizer surface, and vaporized for removal from the vaporizer zone in the vapor phase.

In a specific embodiment, the liquid flow circuit may include a capillary tube into the vaporization zone, and a small "burst quantity" of pressurized purge gas is suddenly introduced to the capillary tube to exhaust the hold-up liquid therein from the channel of the tube, so that it issues onto the vaporizer element, and is vaporized on the vaporizer surface.

The carrier gas flow that is normally used during active vaporization operation to entrain the volatilized precursor may be continued in flow through the vaporizer (e.g., a vaporizer chamber containing the vaporizer surface under heated, elevated temperature conditions) to correspondingly carry the volatilized hold-up liquid from the vaporizer. In addition, a pump may be used downstream of the vaporizer to provide suction or vacuum on the vapor phase in the vaporizer, thereby eliciting a flow stream comprising the volatilized hold-up liquid from the vaporizer.

In this manner, heat, carrier gas flow, and vacuum can act on the volatilized hold-up liquid to transport it out of the vaporizer (e.g., to a downstream deposition zone such as a chemical vapor deposition reactor, or alternatively to a vent line, treatment or recovery system). The effect of this volatilization and "sweep-out" of hold-up liquid on system operation is minimal, since the volume of liquid is relatively small, and the pressure burst at the conclusion of the run (a "run" being an operational cycle during which liquid precursor is being vaporized) is offset by the slight start-up delay, to fill the capillary volume, at the commencement of the next succeeding run.

In order to further minimize the formation of solid residues and other contaminants when temperature-sensitive precursors are employed, a small-size, low-cost vaporizer with a highly effective thermal uniformity control may be utilized to provide decreased liquid volume and residence time and increased flow conductance. An example of such a vaporizer is the VaporSource II™ CVD Vaporizer, commercially available from Advanced Technology Materials, Inc. (Danbury, Conn.). Small-size vaporizers of such type permit highly efficient operation when utilized with a suitable control system, and may be programmatically operated in accordance with a computer-controlled cycle time program, e.g., to eliminate the need for run/vent and flush add-on features and other peripherals required for the operation of various larger vaporizer systems.

In accordance with one embodiment of the invention, an automated air-operated 3-way valve is used to suddenly and momentarily introduce a burst of pressurized inert gas to the liquid feed tube to the vaporizer, to thereby sweep out liquid each time a deposition cycle is completed, or at any other interval appropriate for the specific process. The normal carrier gas continues to purge the vaporizer chamber throughout the run, 'burst purge', and any stand-by steps in the procedure. The vaporizer chamber may also be maintained under vacuum during all of these steps, to ensure rapid efflux of fluid from the vaporizer chamber.

FIG. 1 is a schematic representation of an apparatus 10 including a liquid delivery system and a chemical vapor deposition reactor 80, according to one embodiment of the present invention. The drawing is simplified and does not show all required valves, check valves, instrumentation, etc.

In the FIG. 1 apparatus, the liquid delivery system includes a vaporizer 12 comprising a vaporizer chamber 14 enclosing an interior volume 15. A vaporizer element 16 is disposed in the interior volume 15 of the vaporizer chamber 14, and includes an upper surface receiving precursor liquid from the open-ended lower portion 76 of the liquid delivery line 22. The vaporizer element 16 is heated by a heater 18 coupled in heating relationship with the vaporizer element 16 by a heating line 20, which may for example comprise an electrical resistance heating line which interior to the vaporizer chamber is embedded in the vaporizer element 16. Alternatively, radiant heating, microwave heating, induction heating or other heating means and modalities may be utilized to effective advantage.

The vaporizer chamber 14 has an outlet 60 for discharge of the vaporized precursor (and carrier gas) from the interior volume 15 of the chamber. The outlet 60 is joined to discharge line 62 which is joined in turn to the inlet to the chemical vapor deposition chamber 80, which encloses an interior volume 84 containing a wafer 86 mounted on a heated susceptor 88 heated by resistance heating element 90 (or other heating means of the type described alternatively hereinabove for heating of the vaporizer element). By such arrangement, the wafer 86 is heated to sufficient elevated temperature for deposition of a thin film material on the wafer from the vapor phase contacted with the wafer.

A motive fluid driver 64, e.g., a blower, fan, ejector, eductor, pump or the like may be arranged on chamber exhaust line 66 to impose a vacuum on the CVD chamber 80 and the interior volume 15 of the vaporizer chamber 14, to ensure high rate discharge of vapor and carrier gas from the vaporizer chamber.

Effluent vapor from the chemical vapor deposition process is discharged in line 82 and may be passed to waste venting means, or alternatively, to effluent treatment and/or recovery apparatus (not shown).

The liquid delivery line 22 is connected to the three-way valve 24 having two alternative flow paths 34 and 36 therein, depending on which one of respective first and second positions of the valve is provided at a given time. The three-way valve is coupled at the inlet port of flow path 36 to pressurized gas feed line 38 which in turn connects to supply line 42 joined to pressurized gas source 40.

The three-way valve 24 at the inlet port of flow path 34 is coupled to liquid feed line 26 containing liquid metering device 28 therein, e.g., a liquid mass flow controller, with the liquid feed line 26 being connected in turn to liquid supply line 30 joined to pressurized liquid source 32, e.g., a reservoir of precursor liquid.

As shown, the three-way valve 24 is coupled to a valve actuator 44 which may be of any suitable type, e.g., a hydraulic actuator, electrical motor actuator, pneumatic actuator, solenoid valve actuator, etc. The valve actuator 44 is coupled by signal transmission line 48 to central processing unit 46 (CPU), which may comprise a microprocessor, desktop computer, integrated circuit controller unit, etc., programmably arranged to actuate the valve actuator according to a predetermined cycle time program, so that the valve 24 is alternatingly switched between the respective first and second positions.

In the first position, the liquid from liquid source 32 is flowed through lines 30 and 26 to the flow path 34 and then flowed through line 22 and lower, heated portion 76 of line 22 to the vaporizer surface of vaporizer element 16. In the second position, the pressurized gas from gas source 40 is flowed through lines 42 and 38 through flow path 36 and through line 22 to the lower, heated portion 76 of such line to burst purge the line of any residual liquid contained therein after the completion of the active deposition operation (involving the formation of a coating film on the wafer 86 in the chemical vapor deposition chamber 80).

During such active deposition operation, a carrier gas from a carrier gas source 50, e.g., a cylinder of inert gas, is flowed through lines 52 and 54 to the carrier gas preheater unit 56, wherein the carrier gas is heated to suitable temperature so that premature condensation or byproduct formation is suppressed and minimized. The heated carrier gas then flows in line 58 to the vaporizer chamber 14 and flows therethrough to entrain the vapor produced by volatilization of liquid precursor on the upper surface of the vaporizer element 16, with the resultant carrier gas mixture including the volatilized precursor being flowed out of the vaporizer chamber through outlet 60.

As stated hereinabove, the carrier gas flow from carrier gas source 50 may be carried out continuously during the active vaporization operation, as well as during the regeneration steps.

This optional regeneration step may thus include a burst pulse voiding of the hold-up liquid in the liquid delivery line 22 by the pressurized gas from the pressurized gas source 40, as well as a cleaning of the interior surfaces of the vaporization chamber 14 and the vaporizer element 16 by a solvent medium or other cleaning fluid, introduced from cleaning fluid source 68 and flowed through line 70 to the manifold pipe 72 equipped with spray nozzle heads 74. In this configuration, the cleaning of the vaporizer chamber is carried out in a manner as more fully described in the aforementioned U.S. Pat. No. 5,362,328.

In this respect, it is to be noted that one of the objectives of the burst pulse cleaning system of the present invention is to eliminate or minimize the need for routine solvent flushing of the vaporizer. For a few particularly difficult chemistries, periodic flushing may still be desirable in conjunction with the burst pulse cleaning technique, but in such instances the burst pulse cleaning would be carried out between each wafer change (e.g., during the time after a processed wafer is removed from the susceptor or other substrate mount in the CVD chamber and before a new wafer is mounted in the CVD chamber for the next CVD run), and solvent flushing would only occur at the end of an extended processing period (e.g., at the end of the day, or the end of a week) as part of routine maintenance cleaning operations.

An ancillary goal of the present invention is to provide a simple, economic and effective liquid delivery system arrangement that is highly efficient in minimizing the problems associated with deposits and resultant clogging. The burst pulse apparatus and method of the present invention achieve these objectives. In some instances, it may be desirable to modify the burst pulse apparatus so that solvent flush capability is enabled. e.g., by provision of a "T" fitting and valve for coupling to a source of a solvent cleaning medium, so that cleaning solvent can be selectively and periodically "run in" to the vaporizer chamber for cleaning of the vaporizer surface (vaporization element) and other surfaces in the vaporization chamber.

Figure 2:
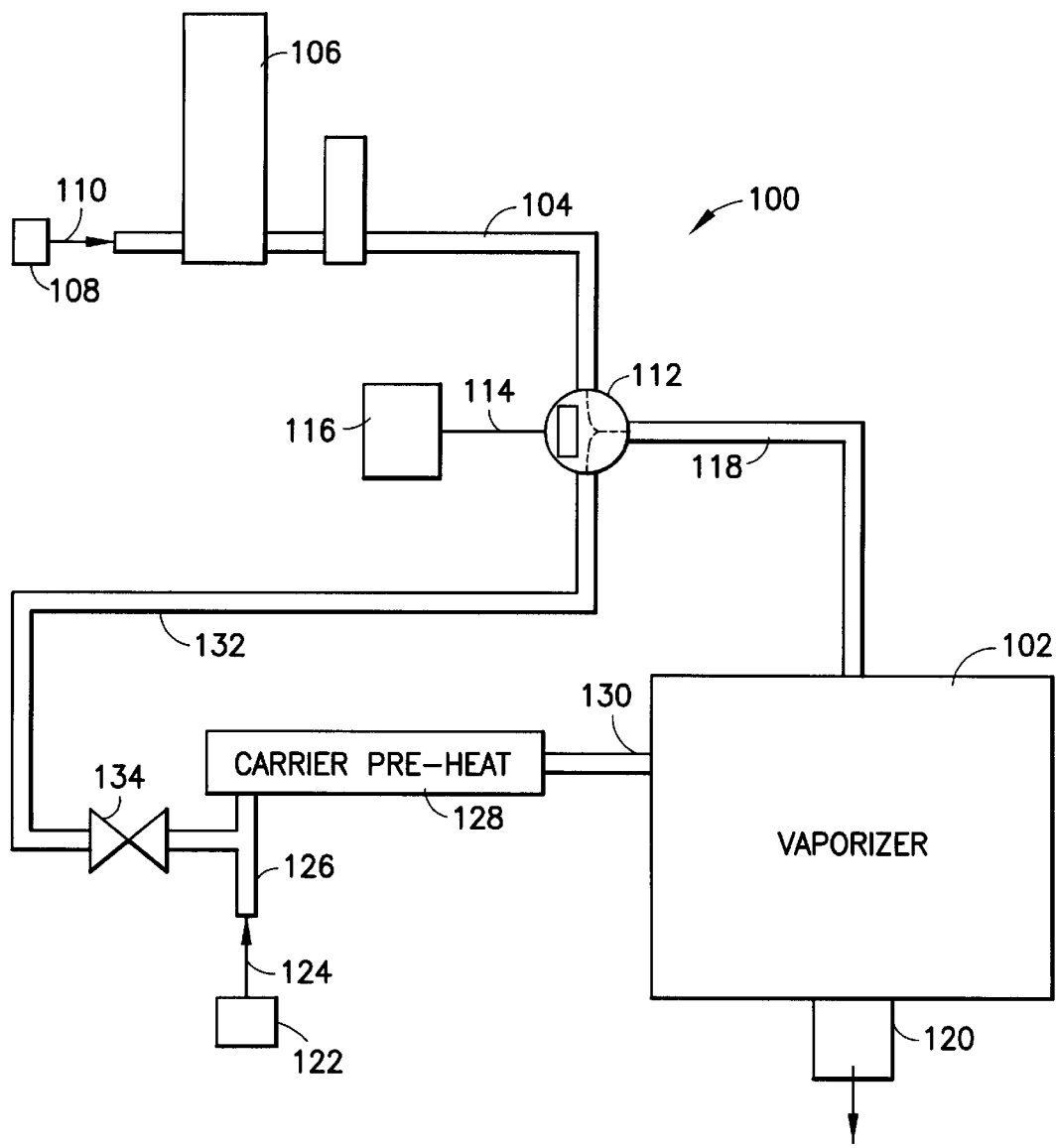
FIG. 2 is a schematic representation of a liquid delivery system according to another embodiment of the invention.

FIG. 2 is a schematic representation of a liquid delivery system 100 according to another embodiment of the invention.

In the FIG. 2 system, a pressurized liquid precursor from liquid source 108 is flowed in line 110 through line 104 containing liquid flow metering device 106 and passed through the three-way valve 112 to the liquid feed line 118 to the vaporizer 102. The resultant vapor produced by the vaporizer then is discharged from the vaporizer in vapor discharge line 120, and may be flowed to a downstream vapor-consuming unit, e.g., a CVD reactor.

The three-way valve 112 is connected by a signal transmission line 114 to the controller module 116, which may be programmed to periodically and alternatingly switch the three-way valve between respective first and second positions thereof.

In a second position of the three-way valve, the pressurized gas from gas source 122 flows in line 124 and line 126 through valve 134 to the gas feed line 132 to the line 118 for purging thereof. For burst purging involving a sudden pulse of high pressure gas, the flow control valve 134 may be selectively operated to be open only momentarily. Such valve operation may be effected by coupling of the flow control valve 134 by suitable actuator and signal transmission means (not shown) to the controller module 116.

Further, the gas feed line 132 can be appropriately sized for a predetemined gas volume (at the known/regulated pressure from pressurized gas source 122). By opening valve 134 the feed line 132 is pressurized. After closure of the associated valve actuator, the 3-way valve 112 can deliver a preset burst volume of purge gas.

Concurrently, through both normal liquid vaporization operation and during the ensuing burst purge clearing of the hold-up liquid in line 118, the pressurized gas from source 122 flowing in lines 124 and 126 is passed through the carrier gas preheater and heated to suitable elevated temperature. Heated carrier gas then is flowed in line 130 into the vaporizer 102 and functions to entrain the volatilized liquid to produce a gas stream comprising the carrier gas and the volatilized liquid. This gas stream is discharged from the vaporizer in line 120.

In the FIG. 2 embodiment, the carrier gas and the burst purge gas are derived from the same gas source 122, as compared to the arrangement shown in FIG. 1, wherein separate gas sources 40 and 50 are depicted.

Figure 3:
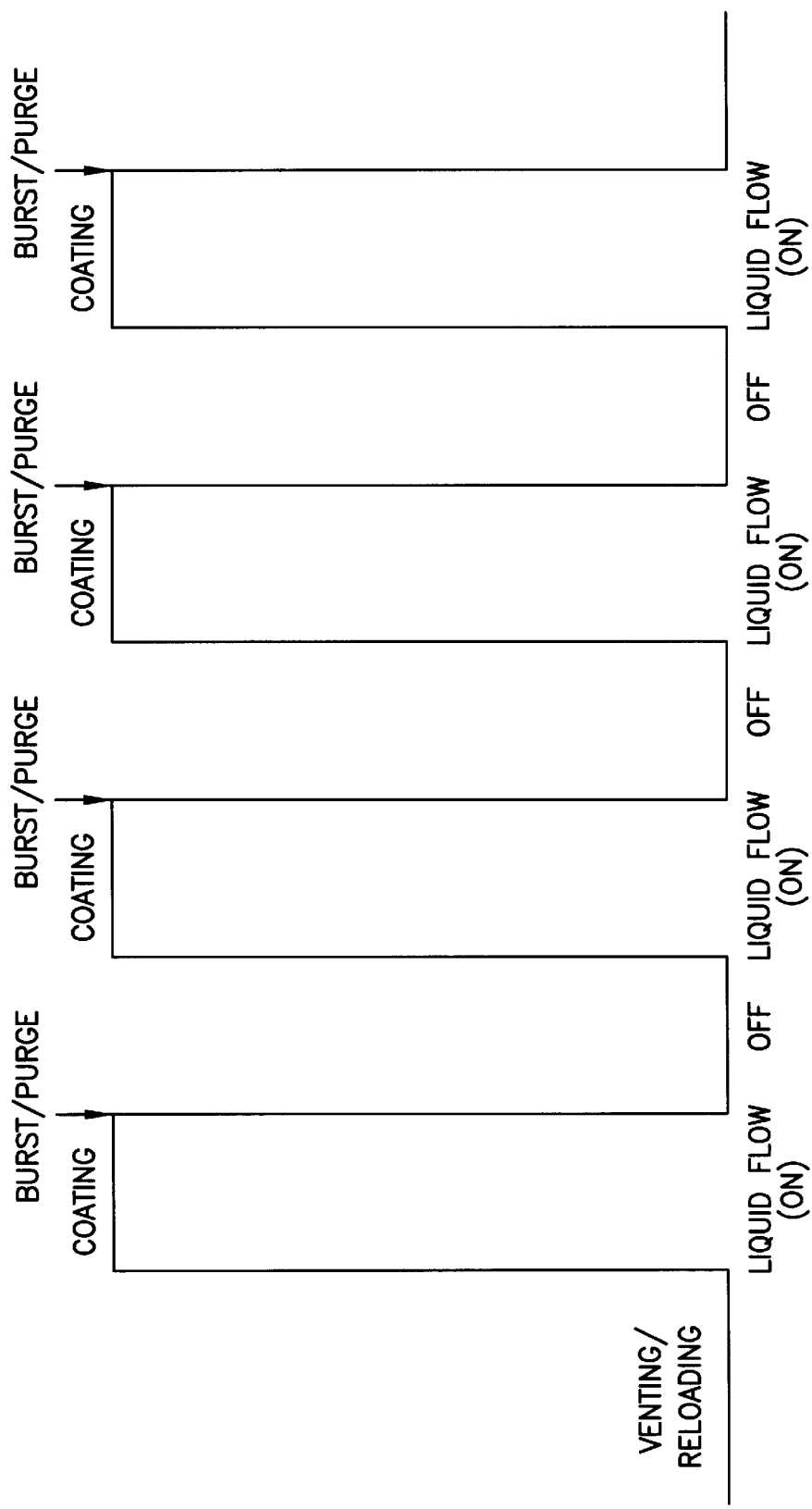
FIG. 3 is a cycle time diagram showing the respective coating and burst purge steps conducted in sequence during the operation of a liquid delivery and chemical vapor deposition system, in accordance with one embodiment of the invention.

FIG. 3 is a cycle time diagram showing the respective coating and burst purge steps conducted in sequence during the operation of a liquid delivery and chemical vapor deposition system, in accordance with one embodiment of the invention.

Following an initial venting and reloading of the liquid feed line of the liquid feed circuit with the liquid (e.g., precursor), the coating (deposition) operation is conducted involving liquid volatilization by the vaporizer. The liquid flow is "on" during such operation.

At the end of the coating step, a burst purge of the liquid feed line is conducted. During the burst purge, the liquid flow is "off," resuming for the next cycle with reloading of the liquid feed line, and resumption of coating.

In this manner, a regular and periodic cycle can be controllably maintained. As a result, a process timer or cycle counter may be employed to monitor the process system for approach to periodic maintenance, after a specified operational time (duration) or number of cycles.

The features and advantages of the invention are more fully shown with reference to the following example.

EXAMPLE

A liquid delivery system of the type shown in FIG. 2 was operated with pressurized liquid at a pressure in the range of from about 5 to about 30 psi to the vaporizer for flash vaporization thereof, to generate precursor vapor of a copper source reagent for formation of copper interconnects on a wafer base structure.

At switch-over from active vaporization operation to regeneration, the liquid hold-up volume in a liquid feed line (capillary tube) to the vaporizer element was less than or equal to about 0.02 milliliters of liquid. Upon switching of the three-way valve, pressurized gas at a pressure of 20 psi or higher (and higher than the liquid pressure) was flowed through the shut-off valve (flow control valve 134) to provide a pressurized burst gas hold up volume of greater than or equal to about 0.25 milliliter, which was used to sweep the hold up liquid out of the capillary tube and onto the vaporizer element for volatilization thereon. The pressurized inert gas was also flowed through the preheater and flowed through the vaporizer chamber to entrain the volatilized liquid therein, with the flow of such carrier gas being continuous throughout the system operation.

The vaporizer was maintained at atmospheric pressure or subatmospheric pressure to ensure rapid flow through the vaporizer chamber of the carrier gas as well as the volatilized liquid precursor.

Although the invention has been variously disclosed herein with reference to illustrative aspects, embodiments and features, it will be appreciated that the aspects, embodiments and features described hereinabove are not intended to limit the invention, and that other variations, modifications and other embodiments will suggest themselves to those of ordinary skill in the art. The invention therefore is to be broadly construed, consistent with the claims hereafter set forth.

What is claimed is:

1. A liquid delivery apparatus for vaporizing a liquid to produce a vapor therefrom, said apparatus comprising:

a vaporizer including a surface arranged to receive liquid thereon;

a liquid feed assembly including (i) a liquid source and (ii) a liquid flow circuit coupled to the liquid source and arranged to discharge liquid onto the vaporizer surface during liquid vaporization operation; and a burst purging assembly including a pressurized gas source joined in gas flow communication with the liquid flow circuit and arranged to introduce a clearance burst of pressurized gas into the liquid flow circuit after completion of the liquid vaporization operation so that hold-up liquid in at least one of the liquid flow circuit and the vaporizer following completion of the liquid vaporization operation is discharged onto the vaporizer surface and vaporized, thereby avoiding retention of said hold-up liquid in the liquid flow circuit and the vaporizer until renewal of liquid vaporization operation.

2. The apparatus of claim 1, comprising a vaporization chamber having the vaporizer surface disposed therein.

3. The apparatus of claim 2, wherein the pressurized gas source is arranged to concurrently flow pressurized gas through the vaporization chamber.

4. The apparatus of claim 2, further comprising means for selectively flowing to the vaporizer surface and interior surfaces of the vaporization chamber a cleaning fluid which is cleaningly effective to at least partially remove vaporization deposits from the vaporizer surface and interior surfaces.

5. The apparatus of claim 1, further comprising a carrier gas supply assembly arranged to flow carrier gas over the vaporizer surface for entrainment of vapor therefrom to produce a gas stream comprising (a) vapor produced by vaporization of liquid on the vaporizer surface and (b) carrier gas.

6. The apparatus of claim 5, wherein the carrier gas supply assembly comprises the pressurized gas source.

7. The apparatus of claim 1, wherein the liquid flow circuit has a three-way valve therein coupling the liquid flow circuit with the pressurized gas source.

8. The apparatus of claim 7, further comprising a valve controller arranged to selectively switch the three-way valve between a first position at which the liquid flow circuit is closed to flow communication with the pressurized gas source, and a second position at which the liquid flow circuit is open to flow communication with the pressurized gas source.

9. The apparatus according to claim 8, further comprising a programmable computer programmably arranged to actuate the valve controller in a cycle time program according to which the three-way valve is cyclically switched between the first and second positions.

10. The apparatus of claim 1, further comprising a chemical vapor deposition reactor coupled in vapor-receiving relationship to the vaporizer.

11. The apparatus of claim 1, further comprising means for selectively flowing to the vaporizer surface a cleaning fluid that is cleanly effective to at least partially remove vaporization deposits from the vaporizer surface.

12. A method of vaporizing a liquid to produce a vapor therefrom, said method comprising:

providing a vaporizer including a surface arranged to receive liquid thereon;

feeding liquid from a liquid source through a liquid flow circuit and discharging liquid onto the vaporizer surface during liquid vaporization operation; and introducing a clearance burst of pressurized gas into the liquid flow circuit after completion of the liquid vaporization operation so that bold-up liquid in at least one of the liquid flow circuit and the vaporizer following completion of the liquid vaporization operation is discharged onto the vaporizer surface and vaporized, thereby avoiding retention of said hold-up liquid in the liquid flow circuit and the vaporizer until renewal of liquid vaporization operation.

13. The method of claim 12, wherein the vaporizer surface is disposed in a vaporization chamber.

14. The method of claim 13, further comprising flowing pressurized gas through the vaporization chamber.

15. The method of claim 13, further comprising selectively flowing to the vaporizer surface and interior surfaces of the vaporization chamber a cleaning fluid which is cleanly effective to at least partially remove vaporization deposits from the vaporizer surface and interior surfaces.

16. The method of claim 12, further comprising flowing a carrier gas over the vaporizer surface for entrainment of vapor therefrom to produce a gas stream comprising (a) vapor produced by vaporization of liquid on the vaporizer surface and (b) carrier gas.

17. The method of claim 16, wherein the carrier gas and the pressurized gas are supplied from a common gas source.

18. The method of claim 12, wherein the liquid flow circuit has a three-way valve therein coupling the liquid flow circuit with the pressurized gas.

19. The method of claim 18, further comprising selectively switching the three-way valve between a first position at which the liquid flow circuit is closed to flow communication with the pressurized gas, and a second position at which the liquid flow circuit is open to flow communication with the pressurized gas.

20. The method of claim 19, further comprising arranging a programmable computer to actuate the valve controller in a cycle time program according to which the three-way valve is cyclically switched between the first and second positions.

21. The method of claim 12, further comprising depositing a film of material on a substrate via chemical vapor deposition from vapor formed by the vaporizer.

22. The method of claim 12, further comprising selectively flowing to the vaporizer surface a cleaning fluid which is cleanly effective to at least partially remove vaporization deposits from the vaporizer surface.

* * * * *